US007614029B2

(12) United States Patent
Manohar

(10) Patent No.: US 7,614,029 B2
(45) Date of Patent: Nov. 3, 2009

(54) METHODS AND SYSTEMS FOR CONVERTING A SYNCHRONOUS CIRCUIT FABRIC INTO AN ASYNCHRONOUS DATAFLOW CIRCUIT FABRIC

(75) Inventor: Rajit Manohar, Ithaca, NY (US)

(73) Assignee: Achronix Semiconductor Corporation, San Jose, CA (US)

( * ) Notice: Subject to any disclaimer, the term of this patent is extended or adjusted under 35 U.S.C. 154(b) by 408 days.

(21) Appl. No.: 11/650,238

(22) Filed: Jan. 5, 2007

(65) Prior Publication Data

US 2008/0168407 A1 Jul. 10, 2008

(51) Int. Cl.
*G06F 17/50* (2006.01)
(52) U.S. Cl. .................. 716/16; 716/3; 716/18
(58) Field of Classification Search ............ 716/3, 716/16–18
See application file for complete search history.

(56) References Cited

U.S. PATENT DOCUMENTS

| 5,067,091 | A  | * | 11/1991 | Nakazawa ............... 716/3 |
| 6,625,797 | B1 | * | 9/2003  | Edwards et al. ......... 716/18 |
| 7,418,676 | B2 | * | 8/2008  | Karaki et al. ........... 716/3 |
| 7,464,361 | B2 | * | 12/2008 | Sandbote ............... 716/18 |
| 2005/0160392 | A1 | * | 7/2005 | Sandbote ............... 716/18 |
| 2005/0198606 | A1 | * | 9/2005 | Gupta et al. ............ 716/18 |
| 2006/0120189 | A1 |  | 6/2006 | Beerel et al. |
| 2006/0190851 | A1 | * | 8/2006 | Karaki et al. ........... 716/3 |

FOREIGN PATENT DOCUMENTS

WO WO-2008085792 A2 7/2008
WO WO-2008085792 A3 7/2008

OTHER PUBLICATIONS

"International Application Serial No. PCT/US2007/089197, Search Report mailed Jun. 27, 2008", 4 pgs.
"International Application Serial No. PCT/US2007/089197, Written Opinion mailed Jun. 27, 2008", 7 pgs.
Fesquet, L., et al., "A Programmable logic architecture for prototyping clockless circuits", Field Programmable Logic and Applications, (Aug. 24-26, 2005), 293-298.
Linder, D. H, et al., "Phased Logic: Supporting the Synchronouus Design Paradigm With Delay-Insensitive Circuitry", *IEEE Transactions on Computers*, vol. 45, (Sep. 1, 1996), 1031-1044.
Manohar, et al., "An Asynchronous Dataflow FPGA Architecture", *IEEE Transactions on Computers, IEEE Service Centre, Los Alamitos*, vol. 53, (Nov. 1, 2004), 1376-1392.
Oberg, J., et al., "Automatic synthesis of Asynchronous Circuits From Synchronous RTL Descriptions", *Norchip Conference*, (Nov. 21, 2005), 1-6.
Traver, C., et al., "Cell designs for self-timed FPGAs", 14th Annual IEEE International, (Sep. 12, 2001), 175-179.

* cited by examiner

*Primary Examiner*—Stacy A Whitmore
(74) *Attorney, Agent, or Firm*—Schwegman, Lundberg & Woessner, P.A.

(57) ABSTRACT

Methods and systems for converting synchronous circuit designs to asynchronous circuit designs, and particularly programmable asynchronous circuit designs. Provide is a systematic, workable and repeatable process for evaluating synchronous circuit designs, converting the wires, switches/connections and logic functions to equivalent-function asynchronous circuit designs and hence implementing a functionally equivalent asynchronous circuit with all the benefits thereof. Further provided are a process for systematically doing the conversion and hardware equivalents (in form or functional description) for the asynchronous components. Using the present invention, any synchronous circuit design can be converted to an asynchronous equivalent, typically with no change to the original design implementation.

29 Claims, 9 Drawing Sheets

SWITCHES

SWITCH POINT

SWITCHES

COMPLETION
DETECTION CIRCUIT

SWITCH POINT

CONNECTION POINT

NAND GATE SYMBOL

NAND GATE CIRCUIT

NAND GATE COMPLETION CIRCUIT

NAND GATE FUNCTION CIRCUIT

METHODS AND SYSTEMS FOR CONVERTING A SYNCHRONOUS CIRCUIT FABRIC INTO AN ASYNCHRONOUS DATAFLOW CIRCUIT FABRIC

FIELD OF THE INVENTION

The present invention relates generally to methods and systems for asynchronous circuits and more particularly to methods and systems for converting synchronous circuit fabric into asynchronous dataflow circuit fabric whereby synchronous circuit designs can be converted into asynchronous circuit designs.

BACKGROUND OF THE INVENTION

As is well known in the art, a field programmable gate array (FPGA) is a class of programmable logic device (PLD) semiconductor devices containing programmable logic components, also known as configurable logic blocks (CLBs), and programmable interconnects, also known as input/output blocks (IOBs). Through configuration of the interconnects, the programmable logic components can be programmed to duplicate the functionality of basic logic gates such as AND, OR, XOR, NOT or more complex combinational functions such as decoders or simple math functions. In most FPGAs, these programmable logic components (or logic blocks, in FPGA parlance) also include memory elements, which may be simple flip-flops or more complete blocks of memories.

As noted above, the hierarchy of programmable interconnects allows the logic blocks of an FPGA to be interconnected as needed by the system designer, somewhat like a one-chip programmable breadboard. These logic blocks and interconnects can be programmed after the manufacturing process by the customer/designer (hence the term "field programmable") so that the FPGA can perform whatever logical function is needed.

FPGAs have several significant advantages over conventional application-specific integrated circuits (ASICs), including a shorter time to market, ability to re-program in the field to fix bugs, and lower non-recurring engineering costs. Applications of FPGAs include digital signal processing (DSP), software-defined radio, aerospace and defense systems, ASIC prototyping, medical imaging, computer vision, speech recognition, cryptography, bioinformatics, computer hardware emulation and a growing range of other areas.

To define the behavior of an FPGA a user provides a hardware description language (HDL) or a schematic design. In electronics, a hardware description language or HDL is a language from a class of computer languages used to develop formal descriptions of electronic circuits. A typical HDL can describe the circuit's operation, its design, and tests to verify its operation by means of simulation.

An HDL's syntax and semantics include explicit notations for expressing time and concurrency, which are the primary attributes of hardware. Languages whose principal characteristic is to express circuit connectivity between a hierarchy of blocks are classified as netlist languages, and some HDLs can also be used for this purpose. One use of an HDL involves designing programmable logic devices, such as FPGAs. The two most widely-used and well-supported HDL varieties used in industry today are VHDL and Verilog. VHDL, or VHSIC Hardware Description Language, is commonly used as a design-entry language for field-programmable gate arrays and application-specific integrated circuits in electronic design automation of digital circuits. Verilog is a hardware description language (HDL) used to model electronic systems. The Verilog language (sometimes called Verilog HDL) supports the design, verification, and implementation of analog, digital, and mixed-signal circuits at various levels of abstraction.

Essential to HDL design is the ability to simulate HDL programs. An HDL program may be tested in hardware, such as by uploading it into a programmable logic device or even by producing a chip based on its specification. However, this is generally a very time-consuming and costly process, and generally the bulk of testing and debugging is done using a program called a simulator. The simulator maintains a resettable "clock", similar to the real clock of a digital device, and allows the designer to print out the values of various registers over time in order to verify and debug the design.

Circuits operate in two fundamental frequency modes, synchronous and asynchronous. A synchronous circuit is a digital circuit in which the various circuit components are synchronized by a centrally generated clock signal. In an ideal synchronous circuit, every change in the logical levels of each storage component is simultaneous. These transitions follow the level change of the clock. Ideally, the input to each storage element has reached its final value before the next clock occurs, so the behavior of the whole circuit can be accurately predicted. Practically, some delay is required for each logical operation, resulting in a maximum speed at which each synchronous system can run. To make these circuits work correctly, a great deal of care is needed in the design of the clock distribution networks. Static timing analysis is often used to determine the maximum safe operating speed.

Synchronous circuits are simulated using synchronous simulation algorithms. These algorithms use centralized-timed to follow the path of events in the circuits. In this manner simulation does not advance until all the events that occurred on the current simulation time are processed. To implement these algorithms, events are stored in a global ordered queue. Each slot in this queue represents simulation time and stores a linked list of events that occur at that simulation time.

An asynchronous circuit is a circuit in which the circuit components operate largely autonomously. The circuit components are not governed by a clock circuit or global clock signal, but instead operate based upon signals that indicate completion of previous instructions and operations. These signals are specified by simple data transfer protocols. This digital logic design is contrasted with the above-described synchronous circuits which operate according to clock timing signals.

As the events of a current time slot are processed for an asynchronous circuit simulation, the output of those events is compared the previous output of corresponding logic elements and; if they differ, new events are generated on logic elements whose input is driven by the output of current event. There is no global centralized time. Instead each data item, or token, carries a time stamp which is indicative of time up to which the data is valid. The evaluation of an event depends on the availability of a token. An asynchronous simulation algorithm can process events that occur at different time instances. Hence it can extract more parallelism compared to synchronous simulation algorithms.

One key component of asynchronous simulation algorithms is determining how to decide the time stamp of a data element. There are different conservative and optimistic approaches. In conservative schemes only safe evaluation times are allowed, that is, evaluation times which guarantee a correct result. A logic element is evaluated only after it receives all its valid input tokens. As a logic element is evaluated its output is decided on the basis of its inputs and time stamp of output is decided by time stamp of the last arriving token and the delay of the logic element. In contrast, an optimistic evaluation of a logic element takes place as soon as an input token arrives at its input. If the output produced turns out to be incorrect, then a roll back takes place to return to a previous know correct state, and messages are sent to forward elements to cancel the effect of the incorrect message sent earlier. This optimistic algorithm has an added cost of state saving and more complex control mechanism to accommodate rollback. The optimistic scheme is generally more efficient as long as rollbacks are few.

A synchronous circuit can also be used to emulate an asynchronous circuit. Such synchronous "handshake" circuits follow the same communication protocols as asynchronous circuits, but continue to use a clock signal for sequencing operations. Examples of such implementations include, for example, "Synchronous Handshake Circuits" by Ad Peeters and Kees van Berkel. Proc. 7$^{th}$ International Symposium on Asynchronous Circuits and Systems, March 2001. These circuits use signals to indicate when a result has been computed by a logic element. This signal (sometimes called a "valid bit") is used in conjunction with the clock. In such a circuit, tokens are explicitly represented using these additional signals. Operations in such a circuit proceed when their inputs are valid, like in a conventional asynchronous circuit. However, clock signals are used to control state transitions as well. The clock frequency of such circuits does not necessarily determine the performance, because not every clock cycle will result in a valid result being computed. However, because clocks are used to control circuit operation, a synchronous simulation method can be used to simulate such circuits.

When a synchronous circuit implementation is used to emulate asynchronous operation, the underlying computation model is still asynchronous because the performance and other properties of the computation are determined by the rate at which tokens are processed. We refer to this underlying computation model as "asynchronous dataflow."

Once the design is completed and verified by simulation, the HDL code is fed into a logic compiler, and the output is uploaded into the FPGA device. This is accomplished through the generation of a technology-mapped netlist. The netlist is fitted to the actual FPGA architecture using a process called place-and-route, usually performed by an FPGA company's proprietary place-and-route software. The above-described simulation may be performed after this netlist generation to validate manufacturer-specific implementations. Once the design and validation process is complete, the binary file generated (also using the FPGA company's proprietary software) is used to (re)configure the FPGA.

As noted above, asynchronous operation provide some significant advantages over synchronous operation. However, in the historical course of development, synchronous circuits were the first to be widely accepted in the industry, particularly in the field of reconfigurable gate arrays. For this reason many more designs currently exist in synchronous logic format than in asynchronous format. One of the significant challenges faced by the industry has been to determine effective ways to convert synchronous circuit designs to asynchronous designs, whereby to take advantage of the benefits of asynchronous operation, without major redesigns or, even worse, conversion design flaws.

There are a variety of synchronous reconfigurable architectures that have been developed by both research groups and companies. Most of these architectures, however, suffer from a performance problem due to the poor scaling of their interconnect.

The present inventor has recognized that the interconnect structure of asynchronous circuits, what is known in the art as the chip 'fabric,' can be a very limiting element in the conversion of synchronous circuits to asynchronous circuits. This is particularly true because of the complexity of the interconnect architecture required to support the asynchronous token verification protocols, the 'handshake' that indicates valid data as between asynchronous logic blocks. The present inventor has recognized the need for improved interconnect methods and systems for supporting converted synchronous circuits in their asynchronous form.

SUMMARY OF THE INVENTION

The present invention includes systems and methods for automatically converting a synchronous architecture into an asynchronous dataflow implementation. The conversion preserves the logical primitives from the original synchronous architecture, thereby allowing the same synthesis algorithms to be used for the dataflow architecture as were used by the original synchronous architecture. That is, the output of the HDL synchronous circuit design can be used to generate the asynchronous form of the same logical circuit with no re-design on the part of the developer or manufacturer. The final asynchronous dataflow implementation can be realized using either synchronous or asynchronous circuits.

In an embodiment of the invention, there are provided methods and systems for converting a synchronous circuit design to an asynchronous dataflow design, an exemplary method comprising:

identifying a synchronous circuit design including a plurality of signal-conducting wires, a plurality of synchronous logic blocks, a plurality of connection boxes including synchronous connection switches connecting the wires to the synchronous logic blocks and a plurality of switch boxes including switch box switches connecting wires to other wires;

determining functional characteristics of the synchronous circuit design;

converting, from the synchronous design, at least some of the plurality of synchronous logic blocks to corresponding asynchronous dataflow logic blocks providing corresponding asynchronous dataflow logic functions with protocol signals;

converting, in the synchronous circuit design, the wires to tracks, each track supporting a plurality of wires whereby to communicate data and protocol signals between the asynchronous logic blocks;

converting, in the synchronous circuit design, dependent on the functional characteristics of the synchronous circuit design, the synchronous switch box switches to programmable switch points; and converting, in the synchronous circuit design, dependent on the functional characteristics of the synchronous circuit design, the synchronous connection switches to programmable switches.

DESCRIPTION OF THE DRAWING FIGURES

These and other objects, features and advantages of the invention will be apparent from a consideration of the following Detailed Description Of The Invention considered in conjunction with the drawing Figures, in which.

Figure 3A:
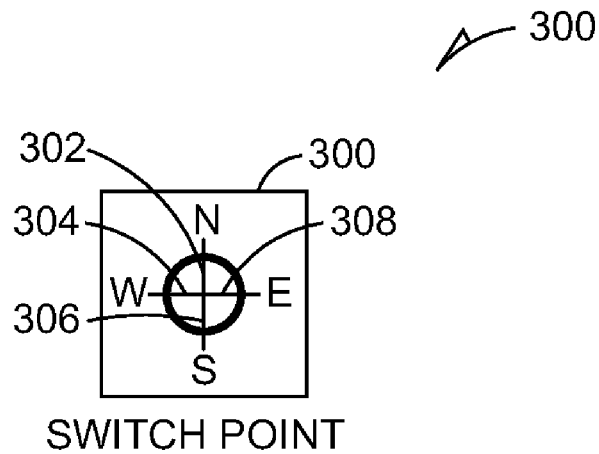
FIG. 3A shows a diagrammatic view of a programmable switch point.
Figure 3B:
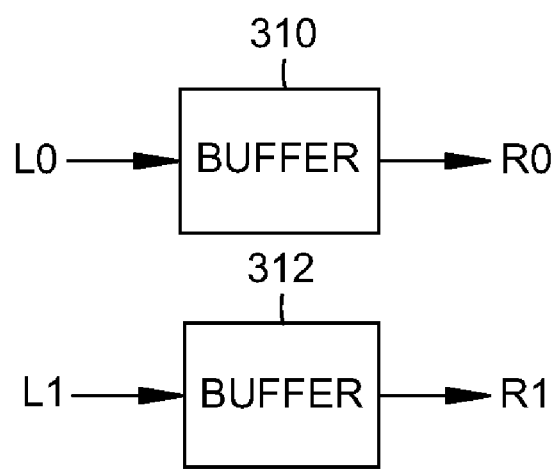
Figure 3C:
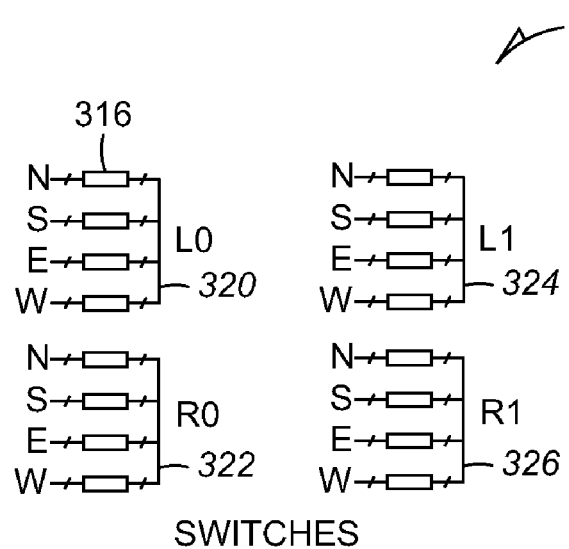
Figure 3D:
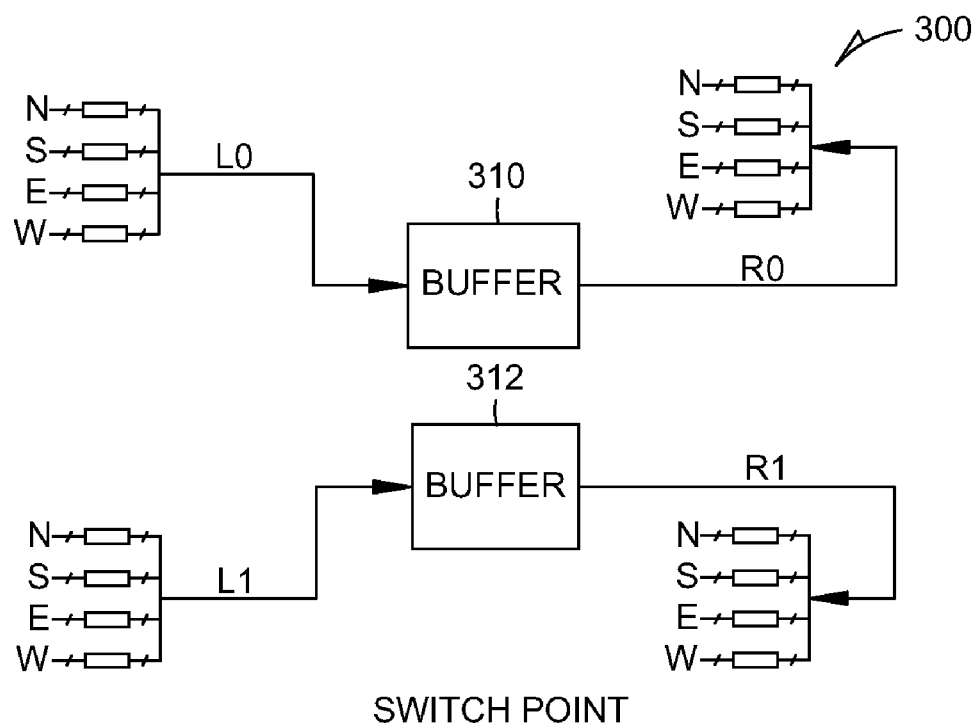
Figure 4A:
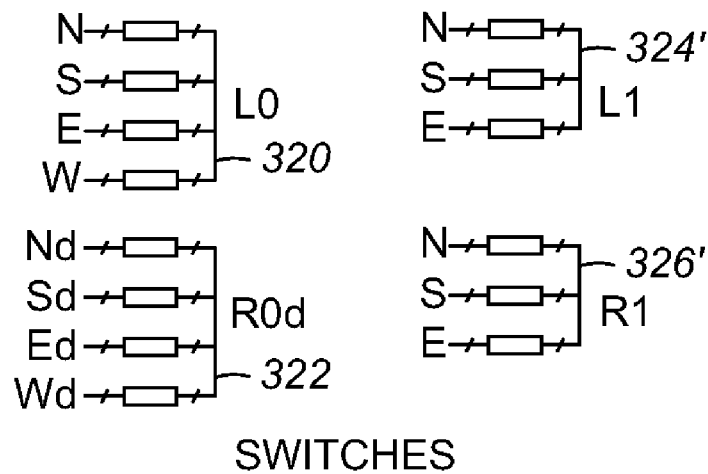
Figure 4B:
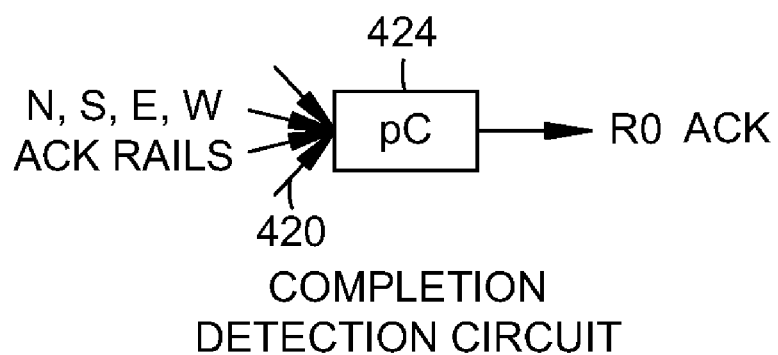
Figure 4C:
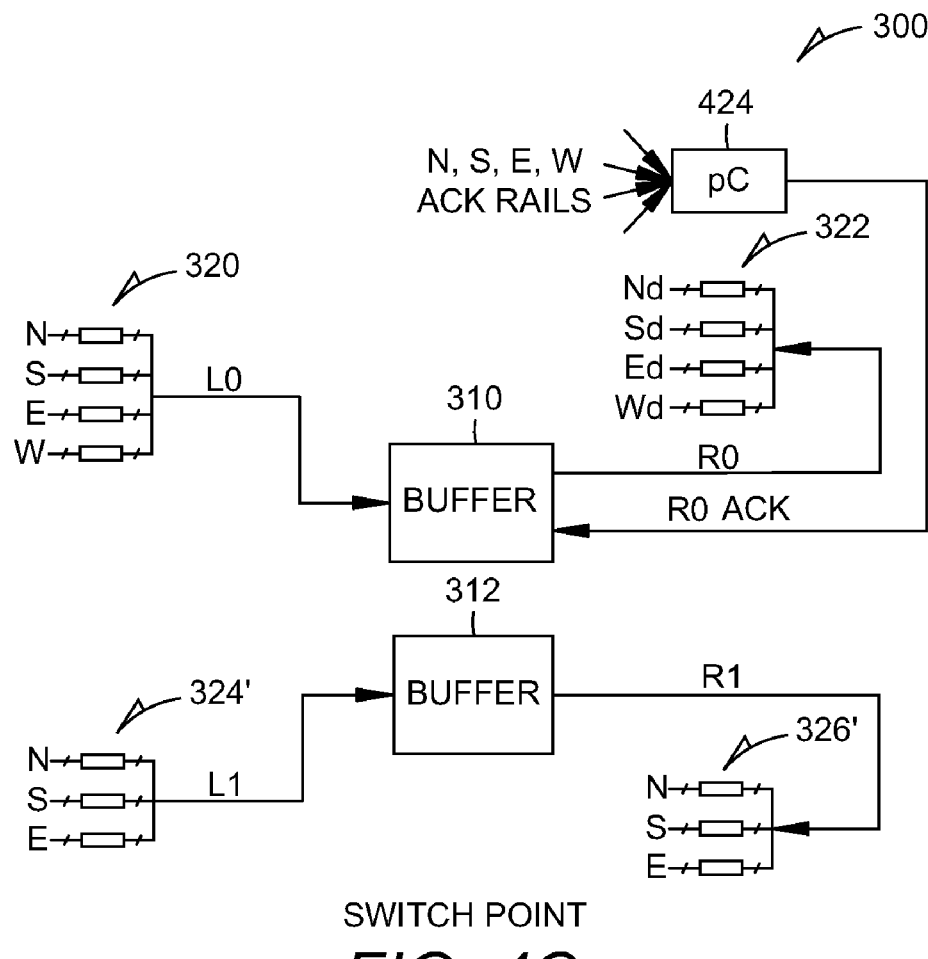
Figure 5:
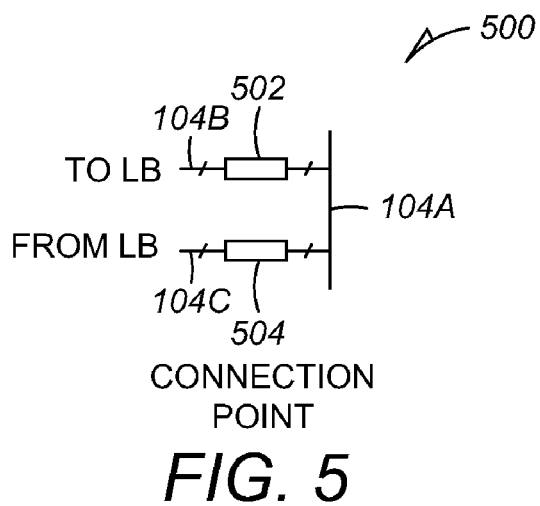
Figure 6:
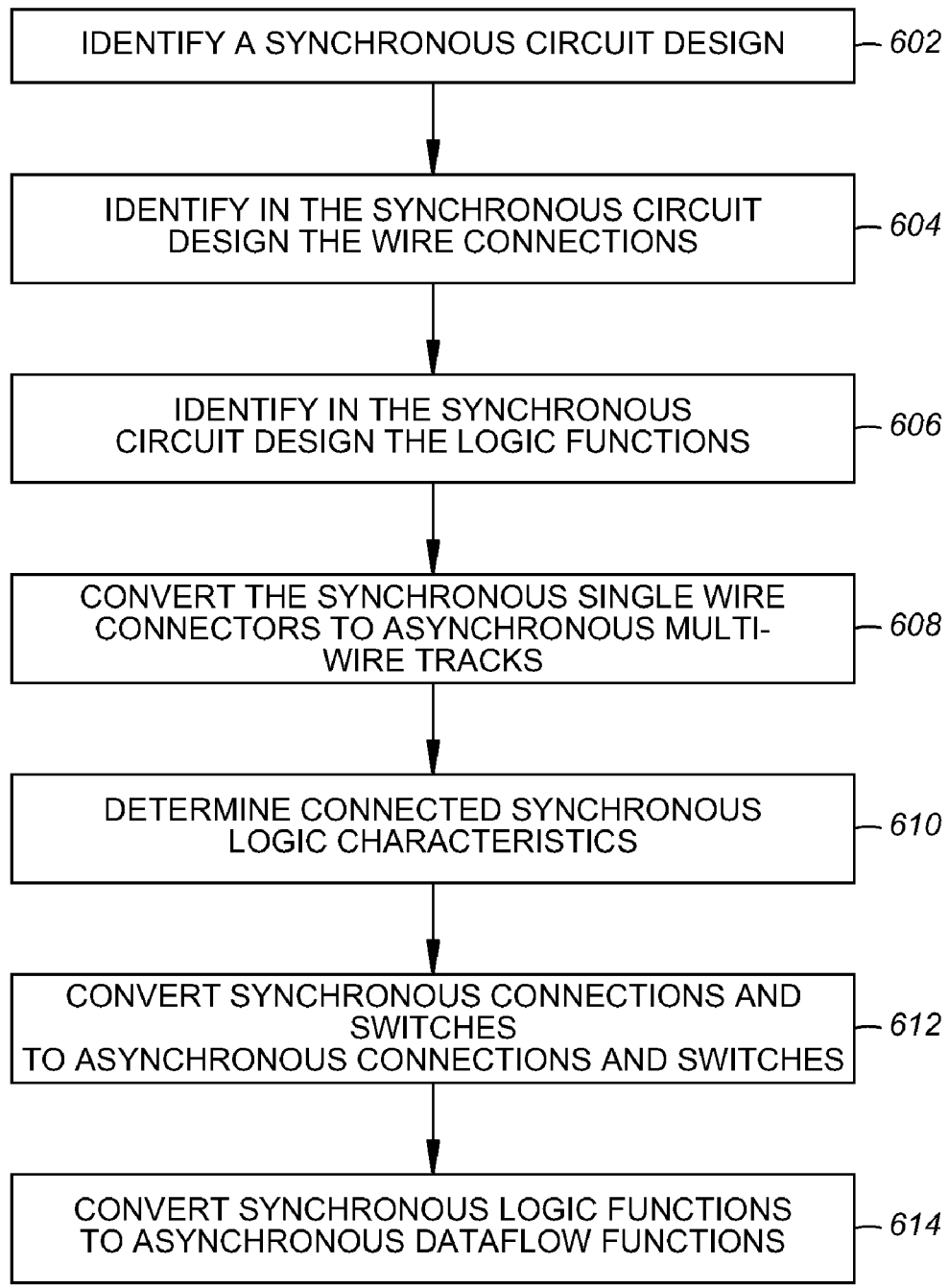
Figure 7A:
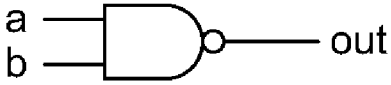
Figure 7A:
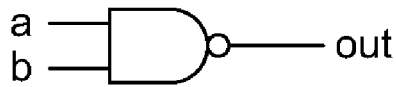
Figure 7B:
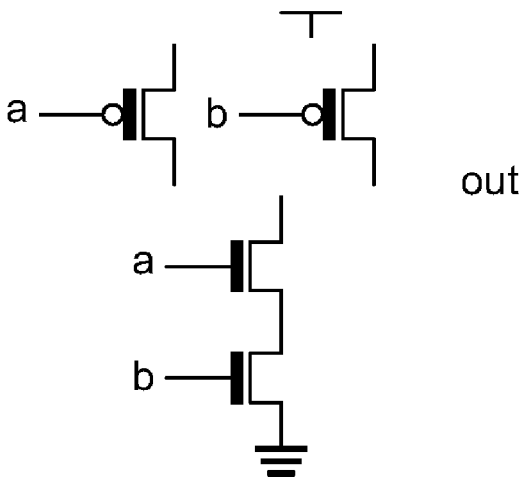
Figure 7B:
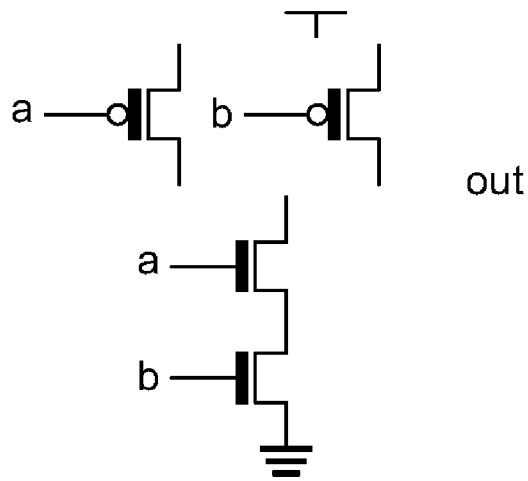
Figure 8A:
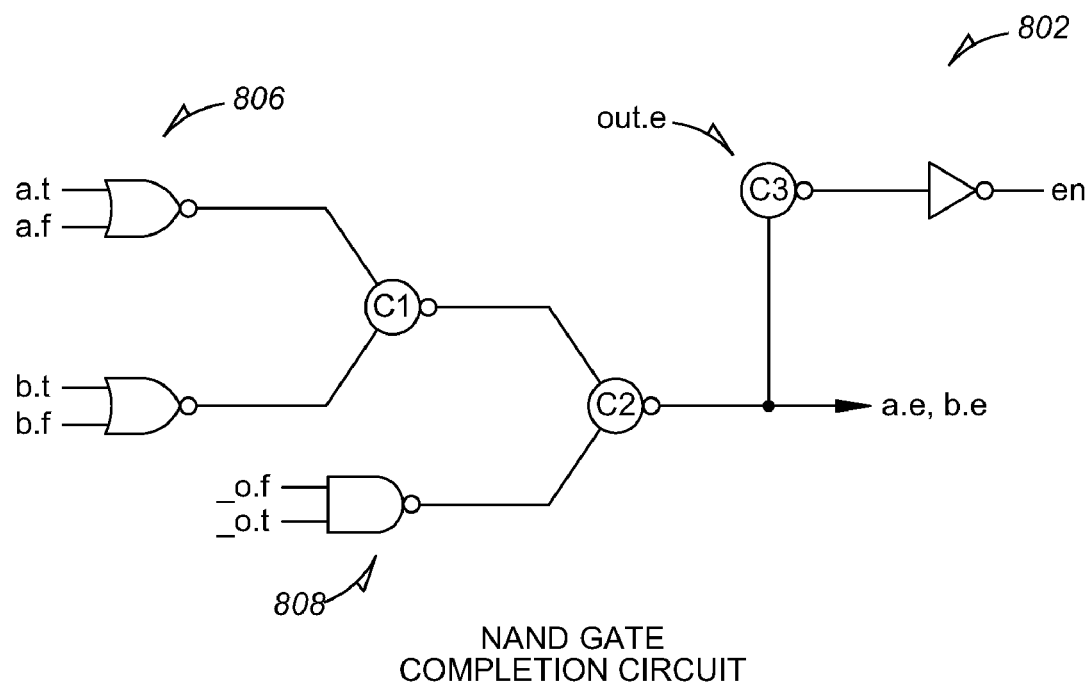
Figure 8B:
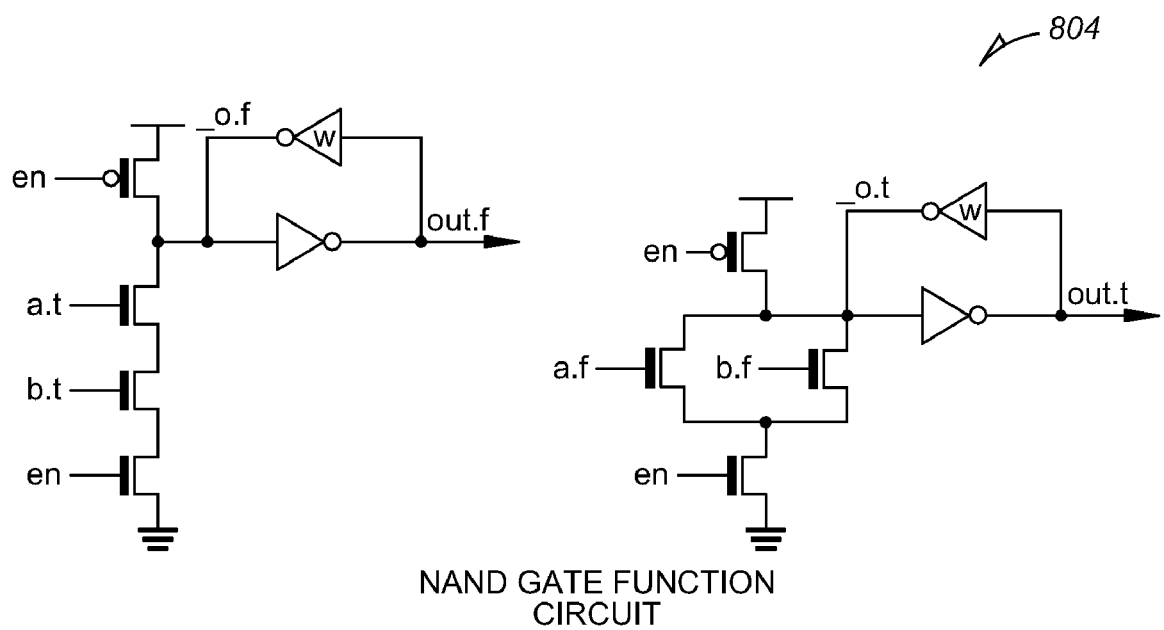
Figure 9:
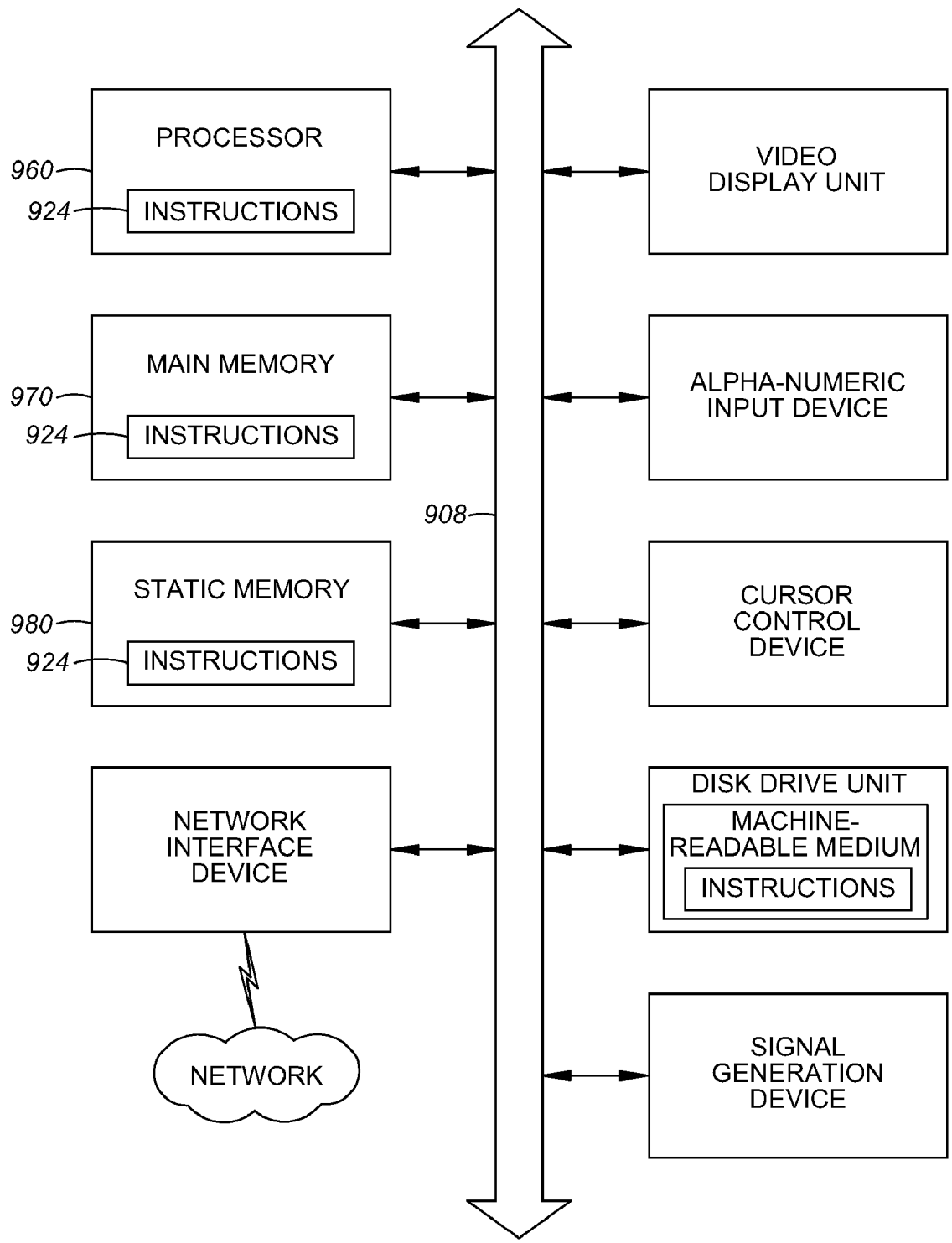

FIGS. 3B and 3C together show schematic components of the programmable switch point implementation hardware;

FIG. 3D shows the assembled components of a first embodiment of the programmable switch point;

FIGS. 4A and 4B together show alternate embodiments of the programmable switch point hardware of FIGS. 3A-D;

FIG. 4C shows the assembled components of the alternate embodiment of the programmable switch point;

FIG. 5 shows a schematic view of a programmable connection point;

FIG. 6 is a flow chart of a process for converting synchronous circuit designs to asynchronous circuit designs in accordance with the present invention;

FIGS. 7A and 7B show, respectively, symbolic and schematic views of a synchronous logic circuit example;

FIGS. 8A and 8B show, respectively, symbolic and schematic views of the synchronous logic circuit example of FIG. 7 converted to an asynchronous design in accordance with the present invention; and FIG. 9 is a diagram illustrating a system in accordance with various embodiments of the present invention.

DETAILED DESCRIPTION OF THE INVENTION

In accordance with the present invention, there are provided herein methods and systems for converting synchronous circuit designs to asynchronous circuit designs, and particularly programmable asynchronous circuit designs. The present invention provides a systematic, workable and repeatable process for evaluating synchronous circuit designs, converting the wires, switches/connections and logic functions to equivalent-function asynchronous circuit designs and implementing a functionally equivalent asynchronous circuit with all the benefits thereof. Provided are a process for systematically doing the conversion and hardware equivalents (in form or functional description) for the asynchronous components. Using the present invention, any synchronous circuit design can be converted to an asynchronous equivalent, typically with no change to the original design implementation, that is using a substantially unchanged netlist, schematic or other design implementation of the synchronous circuit.

As used herein, examples are illustrative and not limiting.

Figure 1:
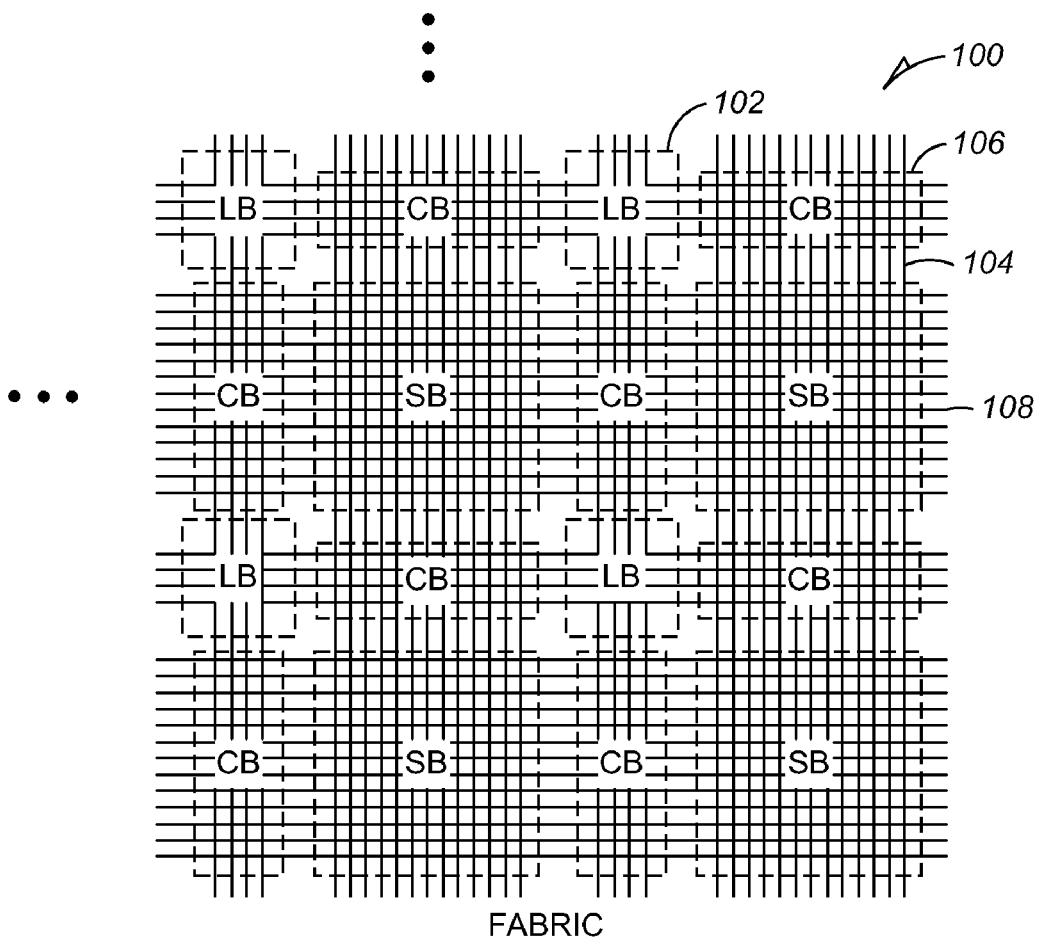
FIG. 1 is a diagrammatic view of an asynchronous circuit chip fabric.

Referring now to FIG. 1, there is shown a standard, reconfigurable portion 100 of a semiconductor circuit chip architecture referred to in the art as an "island style" architecture. The architecture contains programmable arrays of logic blocks (LB) 102 that support a variety of programmable logic functions. Routing tracks 104 in the architecture, illustrated as a plurality of orthogonally oriented tracks, are used to carry electronic signals and implement reconfigurable interconnections between selected logic blocks 102. The major elements of a flexible routing architecture used to interconnect the routing tracks and configure the logic blocks include connection boxes (CB) 106 and switch boxes (SB) 108. In implementation, switch boxes 108 are switches that connect wires to wires, that is the wires in the horizontal and vertical routing tracks. Connection boxes are switches that connect wires to the logic block elements. For purposes of illustration, only exemplary elements in the drawing Figure have been marked. However, the reader will understand the wire tracks, connection boxes and switch boxes are in practice replicated over the surface of a semiconductor chip in order to provide the desired interconnection functionality.

In practice, a typical connection in a switch box of a synchronous circuit design comprises of a multiplexer circuit and signal driver, with the control inputs to the multiplexer being programmable. The multiplexer is used to support a connection from a set of inputs to one of the outputs of the switch box. A typical connection in a synchronous circuit design connection box comprises a programmable switch.

In practice, the structure of the connection and switch boxes determine the connections of the wire tracks to the logic blocks, thereby determining the functionality of the semiconductor chip. In the described embodiment of the invention, the semiconductor chip represented by portion 100 is an FPGA, for example of the type available from Achronix™, Xilinx™, Altera™ or others as are well known in the art.

Figure 2A:
FIGS. 2A, 2B, 2C show diagrammatic views of different semiconductor chip conductor tracks.
Figure 2B:
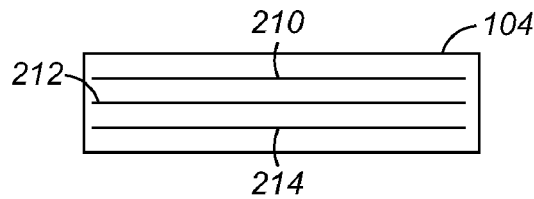
Figure 2C:

With reference now to FIGS. 2A-2C, in a manner well known in the art, tracks 104 comprise, in a synchronous fabric, a single wire. In contrast, in an asynchronous dataflow fabric, each track 104 is implemented using a bundle of wires that provide a dataflow communication channel. FIGS. 2B-2C show two different methods of implementing an individual wire in the conversion to a dataflow interconnect. The track 104 could be implemented in a three wire 210, 212 and 214 configuration as shown in FIG. 2B, or in a two wire 220, 222 configuration as shown in FIG. 2C, the selected configuration based upon the type of handshake protocols implemented as described herein and known in the art. In practice in a typical gate array semiconductor chip, the wires are contained in what are known as tracks or channels, grouped in the 3's or 2's, per channel, as shown.

In the three wire configuration of FIG. 2B, wires 210 and 212 are used to send data, while wire 214 is used for a control signal, for example an acknowledge signal. In the two wire configuration of FIG. 2C, also known as a "single track", both wires 220 and 222 are used for both data and control signals. These wires can be used to implement a wide variety of asynchronous communication protocols, as is well-known in the art.

It will be understood that other configurations of wires are also possible, where an individual track could route more than one bit of information, and the entire programmable routing could contain heterogeneous protocols, bit-widths, and wire configurations. There are also known methods for implementing the track using a single wire and multi-voltage logic signals to represent the data and control signals.

In the described embodiment of the invention, the bit-width of a track, that is the number of bits communicated by the track during a single operation, is determined by the bit-width from the original synchronous architecture such that the bit-width of the asynchronous circuit design will be the same as the bit width of the converted, synchronous circuit design. Different bit widths and multi-phase handshake protocols, including 2-phase and 4-phase handshake protocols, are well known in the art. The described embodiment of the programmable routing architecture uses the three-wire scheme 210, and a standard four-phase handshake protocol for communication with one bit per routing wire.

Considering now generally the conversion of a synchronous circuit design to an asynchronous circuit design, in accordance with the present invention a wire from the original, synchronous architecture, is replaced with a communication channel of the present invention that provides full flow control for the data between logic blocks which is functionally identical to the data flow of the original synchronous circuit design. As will be seen, the communication channel of the present invention can be implemented using the identical machine language design for the synchronous circuit, requiring no re-design to implement the circuit in an asynchronous form.

Switch Box Hardware

With reference now to FIG. 3A, there is shown a programmable switch point 300, including four ports: a north (N) port 302, a west (W) port 304, a south (S) port 306, and an east (E) port 308. It will be understood that a programmable switch point 300 is inserted at every wire track intersection in switch box 108 (FIG. 1). Each programmable switch point 300 includes the programmable switching architecture shown in FIGS. 3B, 3C. With reference to FIG. 3B, two first-in-first-out (FIFO) buffers 310, 312, also referred to together as a single buffer, are shown, having inputs L (L0, L1, respectively) and outputs R (R0, R1, respectively). With reference to FIG. 3C, four programmable switches 318 are shown 320, 322, 324, 326, each including four inputs (one input for each wire in a track) and one output. Each connection in each switch includes a programmable link, one of which is numbered at 316 in programmable switch 320. It will be understood by the reader that, in a conventional manner, programmable links 316 can be controlled as part of the design process to function either as a connection or open circuit and hence connect/disconnect the link.

The configuration of programmable switches 318 shown is one possible implementation of a multiplexer circuit. Other implementations are also known that use different configurations of switches and/or logic gates.

As indicated by the marking nomenclature in FIGS. 3A, 3B, 3C, programmable switch 320 can connect any of the NSEW ports to the input L0 of buffer 310. Programmable switch 324 can likewise connect any of the NSEW ports to input L1 of buffer 312. Each programmable switch 322 and 324 can similarly select the output R0, R1 of corresponding buffer 310, 312, respectively, for connection to any of the NSEW ports. The described switch point 300 including the programmable switches and buffers is thus able to connect any incoming track wire/port to any outgoing track wire/port. FIG. 3D shows the components of the switch point 300 connected in an operational configuration.

To convert a synchronous switch block architecture to an asynchronous dataflow architecture, there is replaced the original signal buffers and wires in the synchronous circuit design architecture with the described dataflow pipeline stage, including replacing each wire with the multi-wire track 104 (shown in FIG. 2B) including a programmable switch point 300 at each terminus. Thus, a synchronous wire with signal buffers is replaced by a multi-wire track (FIG. 2*b*, 2C) with programmable switch points 300. This dataflow element implements a first-in first-out (FIFO) buffer having a finite capacity, and the circuit implementation of the FIFO is determined by the nature of the conversion scheme used to implement the wires from the synchronous architecture.

Each programmable switch point 300 can be implemented in a variety of ways, either buffered, un-buffered, with a full transmission gate, or single pass transistors. These options are well understood by one having ordinary skill in the art. The type of switches used could be a replica of the original synchronous implementation, or a modification based on the new performance, power, and area characteristics of the converted reconfigurable fabric.

The described switch point shown only contains two buffers 310, 312, because there can be at most two independent input to independent output connections supported by the switch point 300 in the described 3-wire channel, with 2 wires for data and 1 wire for protocol signals. Different switch point topologies are possible, and the maximum number of independent routes is determined by wire track and handshake protocol conventions, which in turn determine the number of buffers necessary. The buffers can be implemented in a variety of ways, including a weak-conditioned buffer, a pre-charge half-buffer, a pre-charge full-buffer, or even a synchronous latch or storage element implemented using any logic family including self-resetting logic, static, or dynamic logic families. Also, it will be understood the specific protocol used by the routing track also impacts the circuit used to implement the buffer. These choices will again be clear to those having ordinary skill in the art.

An inherent limitation of the pipelined switch point described in FIG. 3 is that a single buffer can have at most one destination. This limitation arises from the dataflow nature of the interconnect. In a non-dataflow, synchronous interconnect, connecting the output of a buffer to multiple destinations is valid. However, such a connection is invalid for a dataflow switch point because the communication protocol includes flow-control. For example, in the three wire asynchronous protocol of FIG. 2B containing two data wires 210, 212 and an acknowledge wire 214, the data wires transfer information from sender to receiver while the acknowledge wires transfer information from receiver to sender. While one can connect the data wires from one sender to multiple destinations, one cannot connect multiple acknowledge wires together because each receiver has an independent acknowledge signal.

To extend the pipelined switch point to support outputs to multiple destinations, there is provided the additional configuration as shown in FIGS. 4A and 4B. The Figures show a modified version of the same switch point 300 with two changes introduced. Like elements are indicated by like reference numerals to earlier Figures. Altered, corresponding elements are shown primed. The first change is the reduction in configurability of the connections 324', 326' to the second buffer 312. This reduction can be made to the original switch point 300 without sacrificing any flexibility in the routing. To support this, any possible connection to one selected port, for example the west (W) port, of the switch-point are assigned to the inputs/outputs 320, 322 of the first buffer 310. Once that is completed, all other possible connections are supported by the second buffer. This optimization has the benefit of reducing the area required to implement the programmable switch point.

The second change is the support of multiple destinations for the output of the first buffer 310. The new connectivity contains the same connectivity to the input L0 of buffer 310. The connectivity to the output R0 of the first buffer is modified to support fanout. The wires for the routing track consist of data wires that transfer information from the buffer to the corresponding NSE or W switch point port, and the data and acknowledge wires that transfer data from the switch point port to the buffer. The set of switchpoint track wires are directly connected to the output of the buffer via switches 322 as before. The acknowledge wires corresponding to the track wires connected to each of the four ports 420, e.g. wire 214 in track 104 (FIG. 2B) are connected to the acknowledge signal for the output of the buffer R0 using a programmable completion detection element 424. This combines the four acknowledges into a single acknowledge signal that can be provided to the buffer in accordance with the handshake protocols.

The programmable completion detection circuit 415 uses programmable switches with an appropriate AND (or other appropriate logic) function to indicate when the inputs are complete and acceptable, and can be implemented in a variety of ways, as is well-known in the art. One example of a programmable completion detection circuit is shown in published U.S. patent application 2005/0077918 to Teifel et al., incorporated herein in its entirety. Other examples include Current Sensing Completion Detection (CSCD), Activity Monitoring Completion Detection (ACMD), and others as will be known to the reader. In addition to a stand-alone element, another possible implementation is to combine the programmable completion detection element 424 with the circuit implementation of the buffer. This can be done for a variety of reasons, including performance, power consumption, and area.

FIG. 4C shows the components of the switch point 300 connected in an operational fan-out configuration.

In operation, the programmable completion detection circuit waits for all destinations to transfer signals indicating readiness to accept the next data item before generating an acknowledge signal permitting information transfer to the output of the controlled buffer. For different choices of the communication protocol, different circuit elements can be used to implement this function. Appropriate logical functions and their corresponding circuit elements, depending on the selected communication protocol, will be clear to those having ordinary skill in the art.

Connection Box Hardware

With reference back to FIG. 1, each connection box 110 contains a set of connection points that enable a logic block input or output to be connected to a routing track. With reference now to FIG. 5, there is shown a standard connection point 500 for selectively routing signals from a wire 104A, through programmable switches 502, 504, to i) a wire 104B to a selected logic block, and ii) to a wire 104B from a selected logic block. Signals to the logic block and from the logic block are thus connected to the wire track 104A using the programmable switches 502, 504. One functional difference between a connection point 500 and the switch point 300 (FIG. 3) is that the connection point does not include any support for partitioning a routing track. For instance, an individual routing track can be "cut" into two tracks by a programmable switch point 300 by an appropriate setting of the switches, but not by the connection point. That is, in the switch point 300, an input from a north (N) port need not be connected to the south (S) port (even though it is diagrammatically shown in FIG. 3A). However, in connection point 500, the track 104A is indivisible.

A connection box 106 that has directionality in its connectivity can be replicated without modification in the converted reconfigurable architecture as described herein, as further described herein below. However, it will be apparent that the connection point 500 does not as described support fan-out. To modify the connection point 500 to support fan-out, it can be designed in a manner analogous to the programmable switch point as described in FIGS. 4A, 4B above.

Considering generally the switches and connections described above with respect to FIGS. 3 and 4, there are multiple optimizations possible depending on the flexibility required by the programmable track/wire routing. A first optimization is to completely eliminate the buffers (FIG. 3B) from the programmable switch point 300, thereby reducing the pipelining. The removed buffer can be replaced by a wire, or by conventional signal drivers. This is a usable optimization for the connection point 500 as well. A second optimization is to eliminate the configurable switches, in the programmable switches and the connection points, in their entirety, and always connect corresponding data rails from the routing tracks to each other. Only the data rails are directly connected. This optimization is generally more suitable for a connection point, because conventional connection points are normally designed in this way. The acknowledge wires will require a programmable completion detection element to support fan-out.

There are a number of other variations of the described switch configurations that will now be apparent to one of ordinary skill in the art. Examples of variations include having a mixture of pipelined buffers and signal buffers to implement switch points or connection points, having switches on some data rails versus having switches on all data rails, etc. These options result in a variety of trade-offs in flexibility, area, performance, and power consumption of the interconnect, and the actual implementation used will depend on the nature of the application and the importance of various trade-offs.

Converting Configurable Switch Box and Connection Box Connections

In operation, one step in converting a synchronous architecture circuit design to an asynchronous dataflow design is to substitute the above-described asynchronous connections for the synchronous connections. To make the appropriate configurations, it is necessary to identify certain characteristics of the synchronous circuit connections and select the appropriate asynchronous replacement.

A first characteristic or property is if the configurable connections in a synchronous architecture support fan-out or do not support fan-out. A second property to determine is whether or not a connection in a synchronous circuit design is directional or not. A uni-directional connection is one where the transmitter and receiver of information are statically determined, regardless of the possible configurations.

In the cases where fan-out is used in the original synchronous circuit design, the asynchronous equivalent is created by simply substituting the programmable switch points 300' into the connection boxes using the configurable completion detection element as described above with respect to FIG. 4. When fan-out is not used in the original synchronous design, the converted connection does not require any configurable completion detection element and is implemented as shown in FIG. 3 above.

With respect to a unidirectional synchronous circuit design, the converted dataflow connection supporting the equivalent asynchronous design can, in addition to the selection of the correct fan-out/no-fan-out configuration, introduce a dataflow buffer, for example the buffer shown in FIG. 3, to improve performance. The introduction of such a buffer is optional, and the choice should be made based on the metrics of interest (area, power, performance) for the final converted design.

With respect to a bi-directional synchronous circuit design, the converted dataflow connection supporting the asynchronous equivalent includes a buffer with information about directionality used to connect either the input or the output of the buffer to the appropriate routing track. FIG. 3 shows an example of a programmable switch point 300 where the connectivity is bi-directional, and therefore the various ports must be able to connect to either the input or the output of a buffer as shown. A similar configuration exists in a synchronous programmable connection, where the programmable connection includes a signal buffer for performance reasons.

It is thus understood that converting synchronous connections to the above-described asynchronous connections in accordance with the appropriate connection type selection is one step of converting synchronous circuit designs to asynchronous circuit designs in accordance with the present invention.

Converting Synchronous Circuit Designs to Asynchronous Dataflow Designs

As is well known in the art, a synchronous logic block contains a variety of configurable logic functions that typically include but at not limited to: configurable look-up tables (LUTs) of various sizes, carry-chain support, programmable AND gates, programmable XOR gates, programmable MUXes, and others as are well known to the reader.

With reference now to FIG. 6, a process 600 is shown for converting synchronous circuit designs to asynchronous dataflow logic circuit designs in accordance with the present invention.

To convert a synchronous circuit into an asynchronous dataflow circuit, a synchronous design is identified (step 602). As is discussed below, this design may be any of conventional machine and/or circuit configuration designs. The signal wires (step 604) and logic functions (step 606) in the synchronous design are identified. The asynchronous signal wires are replaced with the multi-wire tracks as described above (step 608).

The programmable connectivity, which is the switches and connections, of the synchronous design are identified by the characteristics of the logic being connected (step 610) as described above and converted as described above to the correspondingly appropriate asynchronous switches and connections (step 612). As noted above, different switch box and connection box configurations can be selected based upon logic circuit characteristics such as: fan-out/no fan-out, handshake protocol selection, and unidirectional/bi-directional.

As is described below, the logic functions of the synchronous circuit are converted to the equivalent dataflow building block logic functions (step 614).

Converting Logic Blocks—Generally

To complete the conversion of the synchronous circuit to the equivalent asynchronous circuit, a logic function such as an AND gate is replaced with a dataflow AND gate that waits for valid data to be available on all its inputs, and only then produces a valid output. The implementation of each logic function may or may not be pipelined, and the choice depends on the performance and operating characteristics, e.g. power, performance, size, etc., desired for the resulting architecture. Logic functions like a programmable lookup table are replaced with dataflow lookup tables, where the logic block waits for all its inputs to be valid before performing the lookup operation and producing a valid output.

It will be understood that asynchronous dataflow logic elements generally perform the same function as their synchronous counterparts, are well-known in the art, but operate in an asynchronous manner dependent on the particular choice of communication protocol used with the asynchronous architecture connection tracks that replace the original synchronous architecture wires. For purposes of illustration, exemplary synchronous-to-asynchronous logic block conversions are described below.

Converting Registers

Registers or flip-flops from the original architecture are replaced by FIFO stages that can be initialized with valid asynchronous data tokens and controlled in accordance with standard control protocols. This is sufficient to replicate the functionality of the flip-flops from the original design.

Converting Memory Blocks, and Other Intellectual Property (IP) Blocks

A memory block can be converted into a dataflow implementation in a manner similar to the logic conversion. Dataflow read and write ports are introduced, that replace the original synchronous read and write ports. Other IP blocks (e.g. multipliers) are also converted in a similar fashion by ensuring dataflow interfaces on the primary input and output ports of the logic.

Introducing a Synchronous Boundary

The converted architecture can be "wrapped," that is electronically and logically bounded by, a synchronous circuit boundary that converts the dataflow protocol into simple, synchronous input and output signals. This can be accomplished in a variety of ways. For example, a valid input can be generated at each clock cycle and injected into the dataflow fabric by means of a conversion circuit that is introduced for each input to the dataflow fabric 100 (FIG. 1). As long as the fabric is comprised of components that can operate at a throughput that is higher than the frequency of the clock signal, the fabric will continue to operate correctly.

A similar interface can be applied at outputs. If the throughput supported by the fabric is higher than the rate at which the output is clocked, then there will always be valid data on the output of the dataflow fabric to be transmitted to the synchronous output.

When the dataflow fabric 100 is interfaced with logic families that require clocks, it is important to ensure that the I/O clock frequency is chosen to avoid any instability and/or meta-stability at the interface to the dataflow fabric.

Synchronous Circuit Design Types

It will be understood that the present invention can be applied to convert substantially any circuit design type, without requiring reworking of the design data. Instead, the fabrication is implemented to make the substitutions described herein. Supported design types include, for example:
   Schematic-based designs,
   Hardware Description Language (HDL) designs including for example: VHDL, Verilog, ABEL, AHDL, HDCaml, JHDL, and others as are known to the reader.

Example Synchronous-to-Asynchronous Circuit Conversion

With respect to FIGS. 7A, 7B and 8A, 8B, an exemplary synchronous-to-asynchronous circuit conversion is shown. With respect to FIGS. 7A, 7B, a simple, synchronous logical NAND gate is shown in Boolean symbol form 702 and in actual circuit form 704. NAND gate 702 is seen to include inputs a, b and output 'out.' The circuit itself is implemented in a simple form with field-effect transistors in circuit 704.

Considering the process described above with respect to FIG. 6, the simple synchronous circuit design is identified as the NAND gate (step 602) with wire connections a, b and out (step 604). The synchronous logic function is of course the NAND gate (step 606). In the conversion process the a, b and out wires are each converted to the 3-wire track shown above (step 608), the tracks comprising a.t, a.f (data wires) and a.e (a control wire) for the a wire, b.t, b.f and b.e for the b wire and out.t, out.f and out.e for the out wire, the .t and .f wires comprising data wires and the .e wire comprising a control wire. The connections and switches are assumed in the original design to be unidirectional with no fan-out (step 610) and thus the connection boxes are converted to the programmable connection switches described above and the switch boxes converted to include the programmable switch points with or without buffering (step 612). Because there is no fan-out, no completion detection is required. The NAND logic function is converted to the asynchronous NAND function with dataflow operation as shown in FIGS. 8A, 8B (step 614).

With reference to FIG. 8A, 8B, the same logical NAND function is shown implemented with one particular asynchronous logic family, including a NAND gate function circuit 804 and a NAND gate completion circuit 802. In operation, the gate function circuit 804 operates to calculate the asynchronous NAND logic function, while the completion circuit 802 functions to perform the handshake/control signal functions with the preceding and succeeding logic blocks. As noted above, in accordance with the described invention, each single wire input from the original NAND gate has been converted to the 3-wire track system.

The inputs a.t, a.f and b.t, b.f from a previous logic block are input into two NOR logic gates 806. The output of the NOR gate can be used to determine when the input holds a valid data token value, and when the input does not hold a valid data token value. A valid data token is indicated by having a.t or a.f be high whereat the gate outputs a logic zero or low value. An invalid data token is indicated by both a.t and a.f being low whereat the gate outputs a logic one or high value. The result from the two NOR gates feeds the first completion detection element C1, whose output indicates when both inputs hold a valid data token, or when both inputs do not hold a valid data token.

A NAND gate 808 in completion circuit 802 has inputs _o.t and _o.f, which are the complemented versions of the output out.t and out.f, from the circuit function 804, respectively. The NAND gate 808 output has a similar function as the NOR gate, in that it indicates whether the signals _o.t and _o.f hold a data token. A valid data token is indicated by either _o.t or _o.f being low, whereat the gate outputs a logic one or high value. An invalid data token is indicated _o.t and _o.f both being high, whereat the gate outputs a logic zero or low value. The result is then fed into completion detection element C2, whose other input from C1 indicates whether or not the inputs are valid. This combined completion detection is used to indicate whether or not the input can be acknowledged, via signal a.e and b.e that correspond to the acknowledge signal for inputs a.t, a.f, and b.t, b.f respectively. The out.e signal is part of the track for the output, and comes from the stage to which the data out.t and out.f signals are being transmitted. Finally, the acknowledge signal from the output, out.e, is combined with the output of completion C2 to generate signal en that is used to enable the circuit 804 that computes the logical NAND function.

The following describes one full cycle of operation of the asynchronous NAND gate. In the initial state, "en" is high. If the "a" input is high (represented by having a.t be low and a.f be high) and the "b" input is high (represented by having b.t being high and b.f being low), the n-type transistors in circuit 804 will cause _o.t to be low which in turn sets out.t high. In parallel, the output of gate C1 will become high eventually, and the output of the NAND gate with _o.f and _o.t as inputs will also become high because _o.t is low This causes a.e, b.e to both become low, thereby acknowledging the input.

Once the input has been acknowledged, the inputs a.t, a.f and b.t, b.f can both become low, completing the handshake protocol on the inputs "a" and "b". In parallel, out.e will eventually become low once the output data has been acknowledged. This in turn causes the output of C3 to become high, causing en to become low. When en becomes low, both _o.t and _o.f will be driven high which in turn will reset the outputs out.t, out.f low as well as in parallel cause the output of C2 to become high, making a.e and b.e high—completing the handshake on the inputs "a" and "b". Finally, en will become high again making the gates ready to compute again as soon as out.e becomes high and causes C3 to change its output.

Circuit 804 computes the NAND operation when permitted by the en signal, and produces the correctly computed data token on the output wires out.t and out.f.

The reader will see and appreciate that, in accordance with the described invention, each single wire input from the original NAND gate has been converted to the 3-wire track system—input a has been replaced by a.t, a.f and a.e, b by b.t, b.f, b.e, and out by out.t, out.f, and out.e—where the ".t" and ".f" suffixes indicate the data wires, and the ".e" suffix indicates the handshake wire. The function circuit 804 operates to perform the asynchronous logical AND function, while the completion circuit 802 operates to insure that valid data is received at the inputs and that valid data is generated at the outputs along with appropriate handshake signals to preceding and succeeding logical functions.

Synthesis Transparency

A key property of the current invention is that the dataflow architecture is capable of functionally emulating the original synchronous logical functions while providing the speed and other benefits inherent in an asynchronous configuration.

A variety of synchronous dataflow implementations of the same basic principles are also possible. For example, it is well known that an asynchronous handshake can be emulated using synchronous circuit techniques as described herein above. A synchronous communication protocol that has full flow control (with valid bits, for example) is an example of a way to emulate the asynchronous nature of the described interconnect using synchronous logic, and will now be obvious to those having ordinary skill in the art. These implementations are obvious extensions to the present invention.

Configuration Memory

In addition to logic gates and fixed logic functions, the invention is equally applicable to the conversion programmable synchronous logic. Programmable logic devices, well known in the art and to the reader, include programmable elements such as memory, switches, multiplexers, or other programmable components that are programmed to control the logic function of the device. For example, FIG. 3B shows programmable switches 318 in a switch point. These switches and other programmable elements in the circuits are connected to an appropriate form of storage or memory that holds the configuration value for each programmable element. For example, one way in which a switch can be controlled is by using one bit of memory that specifies whether the switch is open or closed.

After conversion from a synchronous logic design to an asynchronous dataflow design in accordance with the invention, the settings of the switches in the original logic and the corresponding switches in the dataflow logic remain the same. Therefore, the same memory bits can be used to program the converted logic as the original logic. This is true for essentially all programmable logic devices. This is both a feature and advantage of the present invention, enabling the programming for the logic of the original design to remain essentially unchanged as used in the converted design.

In cases where the converted logic design must support fan-out by the introduction of programmable completion detection elements, for example programmable completion detection circuit 415, this new programmable element requires configuration support. The configuration control required by these new programmable elements can typically be inferred from the pre-existing configuration bits for the original synchronous implementation. In the case of completion detection element 415, all that is required is knowledge of whether or not the N, S, E, or W ack rails (FIG. 4B) participate in the completion. This is the same information that is used to control whether or not the data rails for N, S, E, W are connected to the output. Examining FIG. 4C, the configuration required by programmable completion element 424 is the same as the configuration that controls the switches in output group 322.

A circuit designer may choose to use the existing configuration bits to compute any new configuration signals required using simple logic as described above, or the designer may chose to introduce new configuration bits. The choice between these two alternatives depends on design trade-offs such as total power consumption, area, and/or performance of the final design. A feature and advantage of the invention is that the configuration bits required to control the converted design can be made identical, or almost identical to the configuration bits for the original synchronous design. The result is that any software and programming used to program the original synchronous design can be used with almost no modification to program the converted design.

FIG. 9 is a diagram illustrating a system 900 in accordance with various embodiments of the present invention. The system 900 comprises a set of instructions that can be executed to cause system 900 to perform any one or more of the methodologies discussed herein. In alternative embodiments, the system 900 may operate as a standalone device or may be connected (e.g., networked) to other systems. In a networked deployment, the system 900 may operate in the capacity of a server or a client system in a server-client network environment or as a peer system in a peer-to-peer (or distributed) network environment. The system 900 may be realized in the form of a computer. The example system 900 may include a processor 960 (e.g., a central processing unit (CPU). a graphics processing unit (GPU) or both), a main memory 970 and a static memory 980, all of which communicate with each other via a bus 908.

There have thus been provided new and improved methods and systems for converting synchronous circuit designs to asynchronous dataflow designs, and particularly programmable asynchronous dataflow designs. The present invention provides a systematic, workable and repeatable process for evaluating synchronous circuit designs, converting the wires, switches/connections and logic functions to equivalent-function asynchronous circuit designs and hence implementing a functionally equivalent asynchronous circuit with all the benefits thereof. Provided are a process for systematically doing the conversion and hardware equivalents (in form or functional description) for the asynchronous components. Using the present invention, any synchronous circuit design can be converted to an asynchronous equivalent, typically with no change to the original design implementation, that is using a netlist, schematic or other design implementation. The invention has application in the field of electronics and particularly in the fields of circuit design and implementation.

While the invention has been shown and described with respect to particular embodiments, it is not thus limited. Numerous modifications, changes and enhancements will now be apparent to the reader.

What is claimed is:

1. A method for converting a synchronous circuit design to an asynchronous dataflow design and implementing the synchronous dataflow design, the method comprising:
    identifying a synchronous circuit design including a plurality of signal-conducting wires, a plurality of synchronous logic blocks, a plurality of connection boxes including synchronous connection switches connecting the plurality of signal-conducting wires to the synchronous logic blocks and a plurality of switch boxes including switch box switches connecting the plurality of signal-conducting wires to other wires;
    determining functional characteristics of the synchronous circuit design;
    converting, from the synchronous design, at least some of the plurality of synchronous logic blocks to corresponding asynchronous dataflow logic blocks providing corresponding asynchronous dataflow logic functions with protocol signals;
    converting, in the synchronous circuit design, the plurality of signal-conducting wires to tracks, each track supporting the plurality of signal-conducting wires to communicate data and protocol signals between the asynchronous logic blocks;
    converting, in the synchronous circuit design, dependent on the functional characteristics of the synchronous circuit design, the switch box switches to programmable switch points;
    converting, in the synchronous circuit design, dependent on the functional characteristics of the synchronous circuit design, the synchronous connection switches to programmable switches; and
    implementing the asynchronous dataflow design in circuits on an FPGA.

2. The method of claim 1 wherein the functional characteristics of the synchronous circuit design are selected from a group comprising fan-out and directionality.

3. The method of claim 2 wherein the converted synchronous circuit design comprises a fan-out that includes a completion detection circuit positioned to asynchronously detect an execution of the fan-out.

4. The method of claim 2 wherein the converted synchronous circuit design comprising a bi-directionality that includes a buffer positioned to support a directional signal.

5. The method of claim 1 wherein the track is selected from a group comprising a 3-wire track, a 2-wire track and a single wire/multi-voltage track.

6. The method of claim 1 wherein the programmable switches each includes a programmable switch for selectively connecting a logic block element to a wire of the plurality of signal-conducting wires.

7. The method of claim 6 wherein the functional characteristics of the logic block element include a fan-out, and wherein the programmable switch further includes a completion detection circuit.

8. The method of claim 1 wherein the programmable switch points each includes a pair of programmable switches for each wire connection, and wherein a wire at a programmable switch point may selectively be connected to another wire at the programmable switch point.

9. The method of claim 8 wherein the functional characteristics of the logic block element include a fan-out, and wherein the programmable switch point further includes a completion detection circuit.

10. The method of claim 9 wherein the functional characteristics of the logic block element include bi-directionality, and wherein the programmable switch point includes a buffer positioned between the pair of programmable switches at a wire connection.

11. The method of claim 1, further comprising providing a region of synchronous logic to which the converted asynchronous circuit design is connected.

12. The method of claim 1, further comprising selecting the circuits from a group comprising asynchronous operation circuits and synchronous operation circuits.

13. The method of claim 1, wherein:
    the synchronous logic blocks include programmable synchronous logic blocks programmed using configuration signals;
    the asynchronous dataflow logic blocks include programmable asynchronous dataflow logic blocks programmed using configuration signals and corresponding to the synchronous logic blocks; and
    at least some of the configuration signals used to program the programmable synchronous logic blocks are identical to the configuration signals used to program the programmable asynchronous dataflow logic blocks.

14. The method of claim 13, wherein at least one of the configuration signals used to program the programmable synchronous logic blocks are simple logical functions of the configuration signals used to program the programmable asynchronous dataflow logic blocks.

15. A system for converting a synchronous circuit design to an asynchronous dataflow design, comprising:
one or more processors;
memory coupled to the one or more processors, wherein the memory comprises:
means for identifying a synchronous circuit design including a plurality of signal-conducting wires, a plurality of synchronous logic blocks, a plurality of connection boxes including synchronous connection switches connecting the plurality of signal-conducting wires to the synchronous logic blocks and a plurality of switch boxes including switch box switches connecting the plurality of signal-conducting wires to other wires;
means for determining functional characteristics of the synchronous circuit design;
means for converting, from the synchronous design, at least some of the plurality of synchronous logic blocks to corresponding asynchronous dataflow logic blocks providing corresponding asynchronous dataflow logic functions with protocol signals;
means for converting, in the synchronous circuit design, the plurality of signal-conducting wires to tracks, each track supporting the plurality of signal-conducting wires that communicates data and protocol signals between the asynchronous logic blocks;
means for converting, in the synchronous circuit design, dependent on the functional characteristics of the circuit design, the synchronous switch box switches to programmable switch points; and
means for converting, in the synchronous circuit design, dependent on the functional characteristics of the synchronous circuit design, the synchronous connection switches to programmable switches.

16. The system of claim 15 wherein the functional characteristics of the synchronous circuit design are selected from a group comprising fan-out and directionality.

17. The system of claim 16 wherein the converted synchronous circuit design comprises a fan-out that includes a completion detection circuit positioned to asynchronously detect an execution of the fan-out.

18. The system of claim 16 wherein a converted synchronous circuit design comprises a bi-directionality that includes a buffer positioned to support the directional signal.

19. The system of claim 15 wherein the track is selected from a group comprising a 3-wire track, a 2-wire track and a single wire/multi-voltage track.

20. The system of claim 15 wherein the programmable switches each includes a programmable switch for selectively connecting a logic block element to a wire of the plurality of signal-conducting wires.

21. The system of claim 20 wherein the functional characteristics of the logic block element include fan-out, and wherein the programmable switch further includes a completion detection circuit.

22. The system of claim 15 wherein the programmable switch points each includes a pair of programmable switches for each wire connection and wherein a wire at a programmable switch point is selectively connected to any other wire at the programmable switch point.

23. The system of claim 22 wherein the functional characteristics of the logic block element include fan-out, and wherein the programmable switch point further includes a completion detection circuit.

24. The system of claim 23 wherein the functional characteristics of the logic block element include bi-directionality, and wherein the programmable switch point includes a buffer positioned between the pair of programmable switches at a wire connection.

25. The system of claim 15 and further comprising providing a region of synchronous logic to which the converted asynchronous circuit design is connected.

26. The system of claim 15 further comprising selecting the circuits from a group comprising asynchronous operation circuits and synchronous operation circuits.

27. The system of claim 15, wherein:
the synchronous logic blocks include programmable synchronous logic blocks programmed using configuration signals;
the asynchronous dataflow logic blocks include programmable asynchronous dataflow logic blocks programmed using configuration signals and corresponding to the synchronous logic blocks; and
at least some of the configuration signals used to program the programmable synchronous logic blocks are identical to the configuration signals used to program the programmable asynchronous dataflow logic blocks.

28. The system of claim 27, wherein at least one of the configuration signals used to program the programmable synchronous logic blocks are simple logical functions of the configuration signals used to program the programmable asynchronous dataflow logic blocks.

29. A system for converting a synchronous circuit design to an asynchronous dataflow design, comprising:
a processor;
a memory connected to the processor and storing instructions to control the operation of the processor to perform the following acts:
identifying a synchronous circuit design including a plurality of signal-conducting wires, a plurality of synchronous logic blocks, a plurality of connection boxes including synchronous connection switches connecting the plurality of signal-conducting wires to the synchronous logic blocks and a plurality of switch boxes including switch box switches connecting the plurality of signal-conducting wires to other wires;
determining functional characteristics of the synchronous circuit design;
converting, from the synchronous design, at least some of the plurality of synchronous logic blocks to corresponding asynchronous dataflow logic blocks providing corresponding asynchronous dataflow logic functions with protocol signals;
converting, in the synchronous circuit design, the plurality of signal-conducting wires to tracks, each track supporting the plurality of signal-conducting wires that communicates data and protocol signals between the asynchronous logic blocks;
converting, in the synchronous circuit design, dependent on the functional characteristics of the synchronous circuit design, the switch box switches to programmable switch points; and
converting, in the synchronous circuit design, dependent on the functional characteristics of the synchronous circuit design, the synchronous connection switches to programmable switches.

* * * * *